(12) United States Patent
Ohkubo

(10) Patent No.: US 6,635,912 B2
(45) Date of Patent: Oct. 21, 2003

(54) CMOS IMAGE SENSOR AND MANUFACTURING METHOD THEREOF

(75) Inventor: Hiroaki Ohkubo, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/947,343

(22) Filed: Sep. 7, 2001

(65) Prior Publication Data

US 2002/0027239 A1 Mar. 7, 2002

(30) Foreign Application Priority Data

Sep. 7, 2000 (JP) .................................. 2000-272048

(51) Int. Cl.$^7$ ............................................. H01L 27/146
(52) U.S. Cl. ...................................... 257/292; 257/437
(58) Field of Search ................................ 257/292, 369, 257/437

(56) References Cited

U.S. PATENT DOCUMENTS

| | | | | |
|---|---|---|---|---|
| 4,242,695 A | * | 12/1980 | Ouchi et al. ............ | 257/292 |
| 5,235,195 A | * | 8/1993 | Tran et al. .............. | 257/59 |
| 6,096,573 A | * | 8/2000 | Chen .................... | 438/48 |
| 6,218,719 B1 | * | 4/2001 | Tsang ................... | 257/461 |
| 6,369,417 B1 | * | 4/2002 | Lee ...................... | 257/294 |
| 6,492,702 B2 | * | 12/2002 | Fukushima et al. ........ | 257/458 |

FOREIGN PATENT DOCUMENTS

| | | | | |
|---|---|---|---|---|
| EP | 987767 A2 | * | 3/2000 | ....... H01L/31/0216 |
| JP | 2000-031449 | | 1/2000 | |
| JP | 2000031449 A | * | 1/2000 | ......... H01L/27/146 |

* cited by examiner

Primary Examiner—George Fourson
(74) Attorney, Agent, or Firm—Young & Thompson

(57) ABSTRACT

A CMOS image sensor and a manufacturing method thereof are disclosed, by which the sensitivity characteristics of the photodiode and the operation characteristics of the MOS transistor are improved and easy and low-cost manufacturing is realized. The CMOS image sensor comprises a photodiode having a light reception surface covered by a multi-layered antireflection film which is formed by alternately depositing two or more kinds of insulating films whose refractive indexes are different; and at least one MOS transistor having diffusion layers which respectively function as source and drain areas, wherein a silicide layer is formed on each diffusion layer. The photodiode and the MOS transistor are provided on a common substrate and are electrically connected with each other.

3 Claims, 9 Drawing Sheets

CM OS IMAGE SENSOR AND MANUFACTURING METHOD THEREOF

BACKGROUND OF THE INVENTION

1. Field of the Invention

The present invention relates to a CMOS image sensor which includes a photodiode and an MOS transistor on a common substrate, and to a manufacturing method thereof.

2. Description of the Related Art

Conventionally, CCDs (charge coupled devices) are known as solid imaging devices for converting image signals into electric signals. A CCD comprises a photodiode array, and pulsed voltage is applied to the charge stored by each photodiode, so as to output a corresponding electric signal. Recently, CMOS image sensors, having a chip form which includes a photodiode and an MOS transistor, are used as solid imaging devices. A CMOS image sensor can be easily manufactured and the chip size thereof can be reduced.

In order to increase the operation speed of the MOS transistor for converting the charge generated by the photodiode into an electric signal, Japanese Unexamined Patent Application, First Publication, No. 2000-31449 discloses a technique of forming a silicide film in a high-concentration diffusion area of the CMOS transistor. This silicide film is a compound of Si and a refractory metal such as Ti, Co, or the like, and the silicide film can reduce resistance of the diffusing layer or the gate electrode of the transistor (i.e., parasitic resistance), thereby improving the operation speed and reducing the operation voltage.

However, in a conventional CMOS image sensor, incident light may be reflected by a surface of the photodiode (i.e., light reception surface), which degrades the sensitivity. This is because the surface of the photodiode is covered by only an oxide film and incident light is reflected by the light reception surface, thereby reducing the amount of incident light and also reducing the amount of the electric charge after the photoelectric conversion. In order to prevent such reduction, an antireflection film may be provided on the light reception surface. However, in this case, an extra lithography process is necessary, and thus the manufacturing cost increases.

Additionally, in order to improve the operational characteristics of the CMOS transistor used in the CMOS image sensor, it is necessary to form a silicide layer in a diffusion layer, as in the conventional technique. However, when a silicide layer is formed in a diffusion layer of a photodiode, the sensitivity characteristics of the photodiode degrade. In order to prevent such degradation, a specific lithography process is necessary, which also increases the manufacturing cost.

SUMMARY OF THE INVENTION

In consideration of the above circumstances, an object of the present invention is to provide a CMOS image sensor and a manufacturing method thereof, for improving the sensitivity characteristics of the photodiode and the operation characteristics of the MOS transistor, and realizing easy and low-cost manufacturing.

Therefore, the present invention provides a CMOS image sensor comprising:

a photodiode having a light reception surface covered by a multi-layered antireflection film which is formed by alternately depositing two or more kinds of insulating films whose refractive indexes are different; and at least one MOS transistor having diffusion layers which respectively function as source and drain areas, wherein a silicide layer is formed on each diffusion layer, and wherein the photodiode and said at least one MOS transistor are provided on a common substrate and are electrically connected with each other.

Said at least one MOS transistor may have a gate electrode which has side walls.

The present invention also provides a method of manufacturing a CMOS image sensor, comprising the steps of:

forming a multi-layered antireflection film by alternately depositing two or more kinds of insulating films whose refractive indexes are different, on an area including the surfaces of a photodiode and an MOS transistor provided on a common substrate;

patterning the multi-layered antireflection film in a manner such that diffusion layers which will respectively function as source and drain areas of the MOS transistor are exposed and the multi-layered antireflection film remains on the light reception surface of the photodiode;

forming a refractory metal layer on an area which includes the surfaces of the diffusion layers and the remaining multi-layered antireflection film, wherein the metal layer is provided for forming a silicide layer;

forming a silicide layer on the diffusion layers by thermal-processing the common substrate including the metal layer; and removing the remaining portion of the metal layer, which remains after the thermal processing performed in the previous step.

The method may have a step of forming side walls at either side of a gate electrode of the MOS transistor after the multi-layered antireflection film is patterned.

According to the CMOS image sensor having a photodiode whose light reception surface is covered with a multi-layered antireflection film, the reflectance can be reduced within a broad wavelength range and the sensitivity characteristics of the photodiode can be improved. In addition, a silicide layer is formed on each surface of the diffusion layers which function as the source and drain areas, thereby improving the operation speed and decreasing the operation voltage. These effects can be obtained by the CMOS image sensor having a single chip form.

According to the above method, a CMOS image sensor having the above-explained characteristics can be easily manufactured with low cost. That is, in a process of making the silicide reaction occur in the surface of a diffusion layer of the MOS transistor, the insulating multi-layered antireflection film also functions as a mask for preventing a silicide layer from being generated on the light reception surface of the photodiode. Therefore, no extra mask-forming process is necessary.

In addition, in a process of forming the side walls at either side of the gate electrode of the MOS transistor, the insulating multi-layered antireflection film also functions as a mask for preventing an etch-back effect (occurring when the side walls are formed) from affecting the light reception surface of the photodiode. Therefore, no extra mask-forming process is necessary also in this case. Accordingly, a photodiode having superior sensitivity characteristics can be easily manufactured.

DESCRIPTION OF THE PREFERRED EMBODIMENTS

Hereinafter, embodiments according to the present invention will be explained in detail with reference to the drawings.

Figure 1:
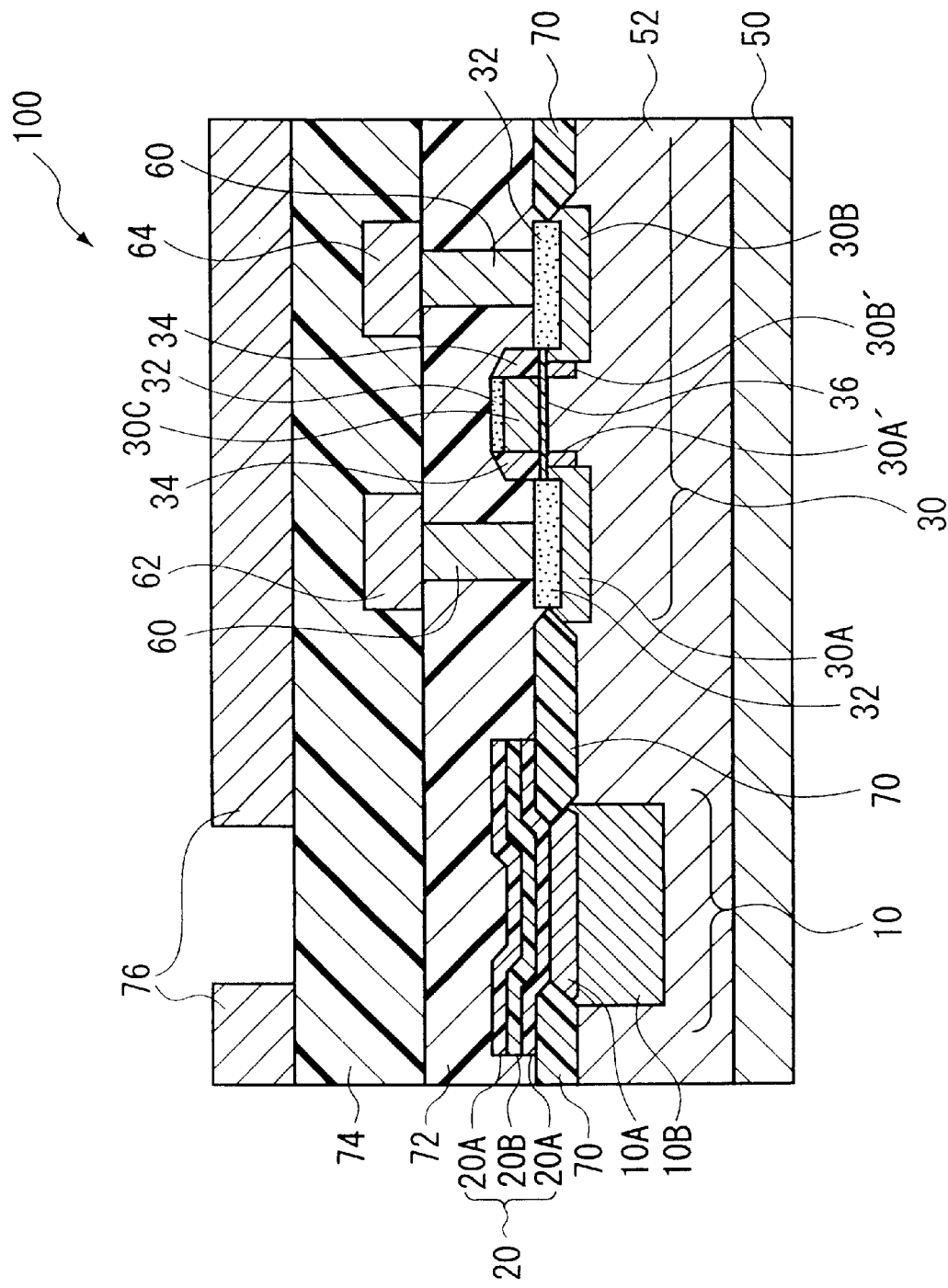
FIG. 1 is a cross-sectional view showing the structure of the CMOS image sensor as an embodiment according to the present invention.

An embodiment of the CMOS image sensor will be explained with reference to FIG. 1. FIG. 1 is a cross-sectional view showing the CMOS image sensor 100 as an embodiment of the present invention. FIG. 1 shows general cross-sectional views of a photodiode 10 and an n-type MOS (metal oxide semiconductor) 30 (called MOSFET 30, hereinbelow) in a pixel of the CMOS image sensor 100, where the MOSFET 30 is a portion of a CMOS transistor. For convenience of explanation, only the n-type MOS is shown; however, in the actual structure, a p-type MOS to be coupled with the n-type MOS is formed on the right, front, or back side of the n-type MOS with respect to the plane of FIG. 1, and the CMOS transistor is realized by such coupled n-type MOS and p-type MOS. In this case, the p-type MOS can be formed by modifying a part of the p-type well 52 (explained below) to an n-type well or providing an n-type common substrate. The MOSFET 30 may have a function of (i) detecting the charge generated in the photodiode 10 as an electric signal, (ii) transferring an electric signal to an external device, or (iii) resetting the electric potential of the photodiode 10 to the initial level.

In the CMOS image sensor of the present invention, it is not always necessary that both the n-type and p-type transistors be connected to the photodiode. The structure and connection of each transistor can be flexibly determined according to the functions assigned to each pixel. Accordingly, in the following explanations of the present invention, it is assumed that the image sensor has a photodiode and one or more transistors, In FIG. 1, a p-type well 52 is formed on a common substrate 50 made of silicon. The p-type well 52 consists of a p-type diffusion layer in which the photodiode 10 and the MOSFET 30 are formed in an embedded form. The photodiode 10 consists of an n-type diffusion layer 10B formed in the p-type well 52 and a p-type diffusion layer 10A formed on the surface of the n-type diffusion layer 10B, thereby forming an embedded photodiode structure. The light reception surface of the photodiode 10 (i.e., the surface of the p-type diffusion layer 10A) and its peripheral area are covered with a multi-layered antireflection film 20 formed by alternately depositing different kinds of insulating films 20A and 20B which have different refractive indexes.

This multi-layered antireflection film has two or more deposited layers whose refractive indexes are not the same and the film has a specific optical thickness, so that the reflectance can be reduced within a wavelength range broader than that applied to a single-layered film. In addition, the multi-layered antireflection film 20 must consist of insulating films so as to prevent a reaction between a refractory metal layer and the multi-layered antireflection film 20 during the silicide reaction explained below. The insulating film 20A may be an oxide film such as a silicon oxide film and the insulating film 20B may be a nitride film such as a silicon nitride film. The structure of the antireflection film is not limited, and insulating films for constituting the antireflection film and the conditions of deposition (i.e., the order of each layer and the number of deposited layers) are determined based on any known design method.

On the other hand, diffusion layers 30A and 30B, functioning as source and drain areas of the MOSFET 30, are formed in the p-type well 52. A gate oxide film 36 consisting of a silicon oxide film (such as $SiO_2$) is formed on the top surface of the p-type well 52, that is, a surface between the diffusion layers 30A and 30B. A gate electrode 30C which is a polysilicon layer is formed on the gate oxide film 36.

A low-concentration diffusion area 30A' having a low carrier concentration is provided in the vicinity of the diffusion layer 30A in a manner such that this area 30A' faces the gate electrode 30C. Similarly, a low-concentration diffusion area 30B' having a low carrier concentration is provided in the vicinity of the diffusion layer 30B in a manner such that this area 30A' faces the gate electrode 30C. Accordingly, an LDD (lightly doped drain-source) structure is formed, so that degradation of the characteristics of the transistor, such as a hot carrier phenomenon, is prevented. In addition, a side wall 34 consisting of a silicon oxide film is formed on a side face of the gate electrode 30C.

A Ti silicide (TiSiX) layer 32 is formed on the surface of each of the diffusion layers 30A and 30B and gate electrode 30C. This silicide layer 32 is made of a compound of Si and a refractory metal, such as Ti or Co, and the method of forming this layer will be explained below in detail. If the diffusion layers 30A and 30B and the gate electrode 30C each have a silicide layer 32, the resistance of these layers (i.e., parasitic resistance) is reduced, so that the operation speed of the transistor can be improved and the operation voltage of the transistor can be decreased. Additionally, in order to prevent the sensitivity characteristics of the photodiode 10 from degrading, no silicide layer is provided in the p-type diffusion layer 10A and the n-type diffusion layer 10B.

A silicon oxide film 70 for separating elements (i.e., field oxide film) is formed on the surface of the p-type well 52 between the photodiode 10 and the MOSFET 30. On the surface of the multi-layered antireflection film 20 and the surface of the silicide layer 32 (on the diffusion layers 30A and 30B, and the gate electrode 30C), a first interlayer insulating film 72 and a second interlayer insulating film 74 are deposited in turn. In the bottom face of the second interlayer insulating film 74, that is, the surface facing the first interlayer insulating film 72, Al wiring lines 62 and 64 are embedded in a manner such that the lines 62 and 64 respectively extend above the diffusion layers 30A and 30B and respectively function as a source electrode and a drain electrode. Polar contact plugs 60, 60 are formed through the first interlayer insulating film 72, so as to electrically contact the diffusion layers 30A and 30B to the Al wiring lines 62 and 64. In addition, an Al shielding film 76 is formed on the surface of the second interlayer insulating film 74, except for a portion (of the surface) positioned above the light reception surface of the photodiode 10, as shown in FIG. 1.

In the CMOS image sensor in the present embodiment, the light reception surface of the photodiode 10 is covered with the multi-layered antireflection film 20; thus, the reflectance can be low within a wide wavelength range and the sensitivity characteristics of the photodiode can be improved. Additionally, in the MOS transistor (such as MOSFET 30), a silicide layer is provided on portions of the surface of the diffusion layers which function as source and drain areas (and also the gate electrode, preferably); thus, the operation speed can be improved and the operation voltage can be decreased. Furthermore, the multi-layered antireflection film 20 consists of insulating films; thus, it is possible to prevent a silicide layer from being generated in the photodiode during the silicide reaction and the relevant characteristics thus being degraded.

Below, the first embodiment of the processes of manufacturing the CMOS image sensor 100 as shown in FIG. 1 will be explained with reference to FIGS. 2A to 2P.

Figure 2A:
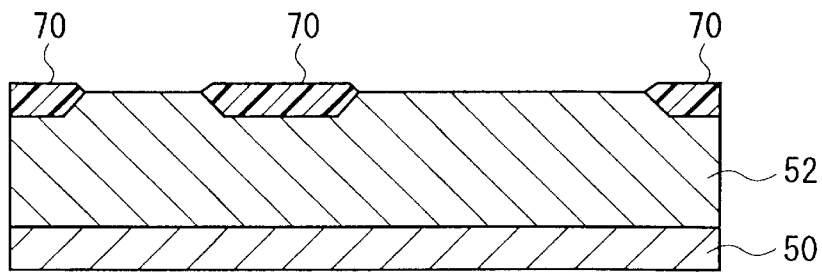
FIGS. 2A to 2P are cross-sectional views for explaining the processes of the first method of manufacturing the CMOS image sensor shown in FIG. 1

In the first process, p-type impurities (such as boron) are injected into a common substrate 50 made of silicon, by using ion implantation or thermal diffusion, so as to form a p-type well 52 (see FIG. 2A).

Next, a predetermined area of the p-type well 52 is masked with a silicon nitride film, and a silicon oxide film 70 for separating elements (i.e., a field oxide film) is deposited onto the other area (that is, other than the predetermined area) by using a thermal oxidation method or the like.

Figure 2B:
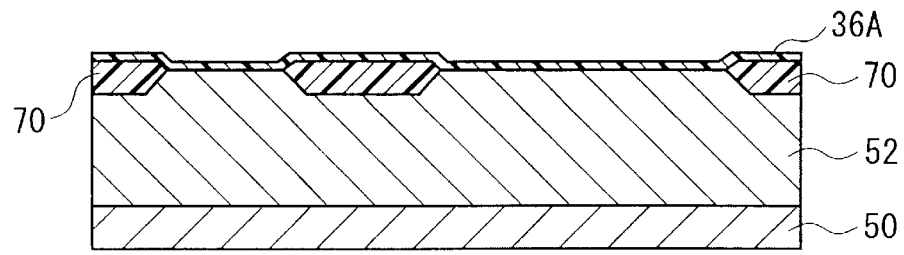
Figure 2C:
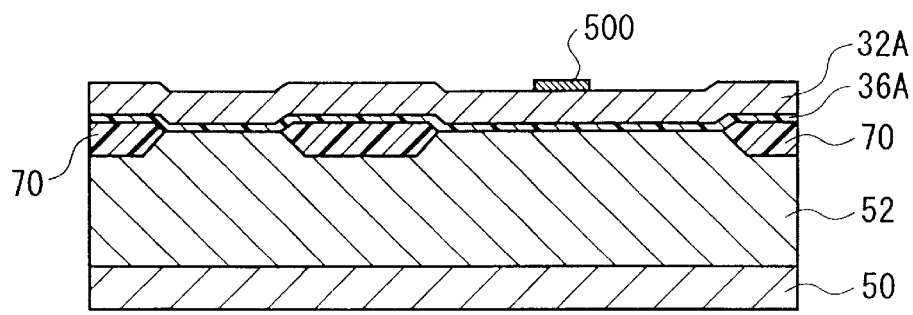

After removing the silicon nitride film, a silicon oxide film layer 36A made of $SiO_2$ or the like is formed on the surface of the silicon oxide film 70, by using the thermal oxidation method (see FIG. 2B). This layer 36A is provided for forming a gate oxide film (explained below).

In the next process, a multi-layered antireflection film 20 is formed in an area including the surface of the photodiode 10 (i.e., the surface of the p-type diffusion layer 10A) and the surface of the MOSFET 30 (i.e., the surfaces of the source and drain areas 30A and 30B and the gate electrode 30C). This multi-layered antireflection film 20 is formed by alternately depositing an insulating film 20A which is an oxide film and an insulating film 20B which is a nitride film. A mask pattern 540 is formed on the multi-layered antireflection film 20 by photolithography (see FIG. 2J).

Figure 2D:
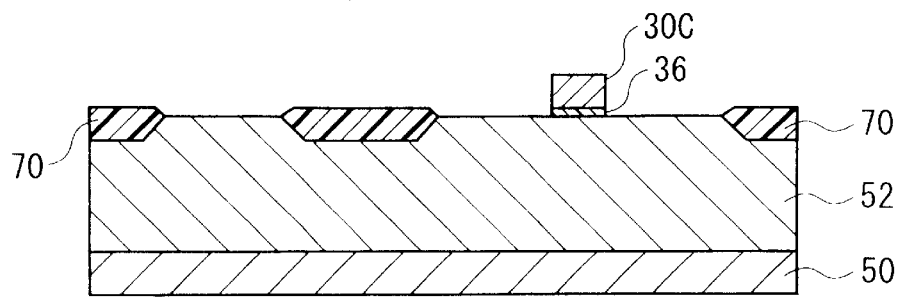

In the next process, the polysilicon layer 32A and the silicon oxide film layer 36A are removed except for the area on which the mask pattern 500 is formed, by using etching, and the mask pattern 500 is then removed, so that a gate electrode 30C and a gate oxide film 36 (under the gate electrode 30C) are formed (see FIG. 2D).

Figure 2E:
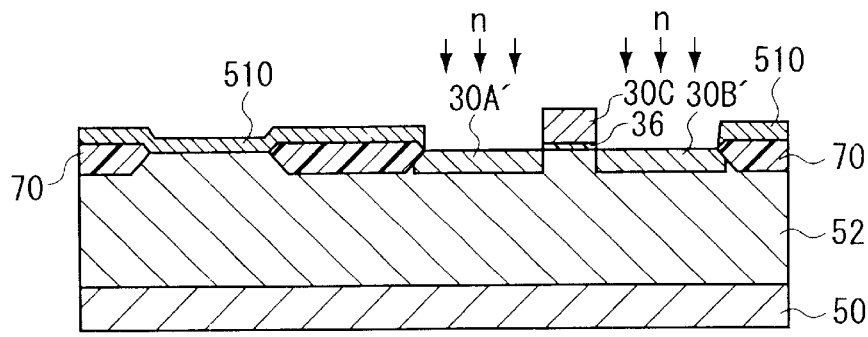

In the next process, a mask pattern 510 for exposing only portions corresponding to low-concentration areas which will be provided in the p-type well 52 is formed by photolithography, and n-type impurities having a low concentration (such as phosphorus) are injected by using ion implantation so that low-concentration diffusion layers 30A' and 30B' are formed (see FIG. 2E).

Figure 2F:
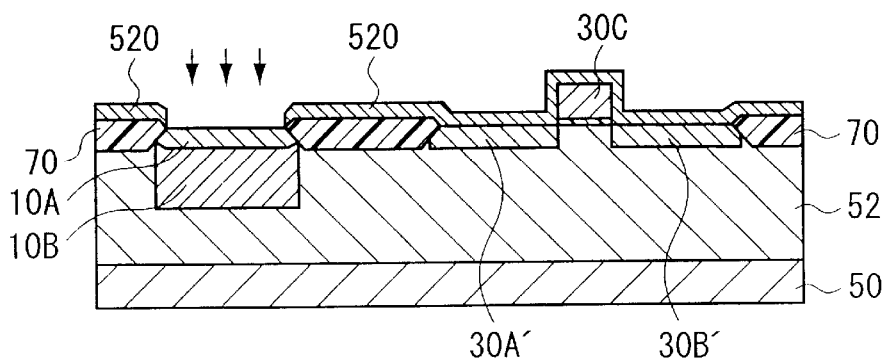

The mask pattern 510 is then removed, and a mask pattern 520 for exposing only the portion which will function as a photodiode in the p-type well 52, by using photolithography (see FIG. 2F). Then, after an n-type diffusion layer 10B is formed by injecting n-type impurities (such as boron) by ion implantation or the like, p-type impurities (such as phosphorus) are injected so that a p-type diffusion layer 10A is formed on the n-type diffusion layer 10B.

Figure 2G:
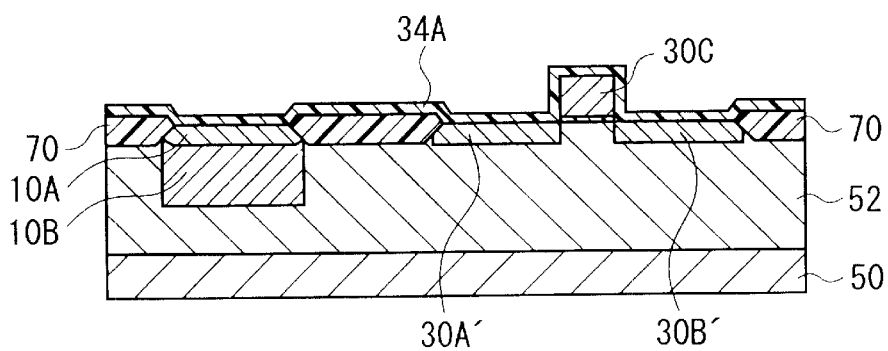
Figure 2H:
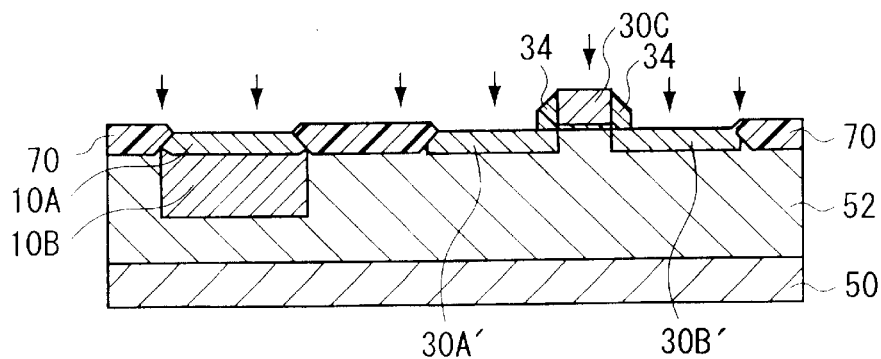

In the next process, a silicon oxide film layer 34A made of $SiO_2$ or the like, provided for forming side walls (explained below), is formed on the entire surface (see FIG. 2G). The surface of the silicon oxide film layer 34A is then removed by dry etching by employing ions or the like, so that owing to the etch back, side walls 34, 34 are formed at either side of the gate electrode 30C (see FIG. 2H).

Figure 2I:
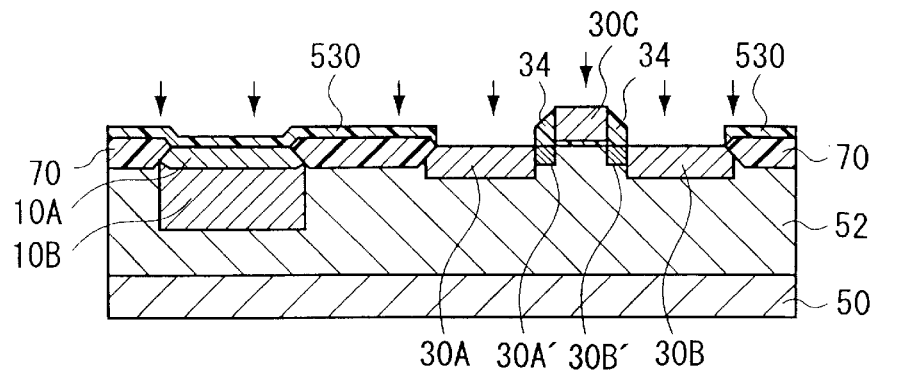
Figure 2J:
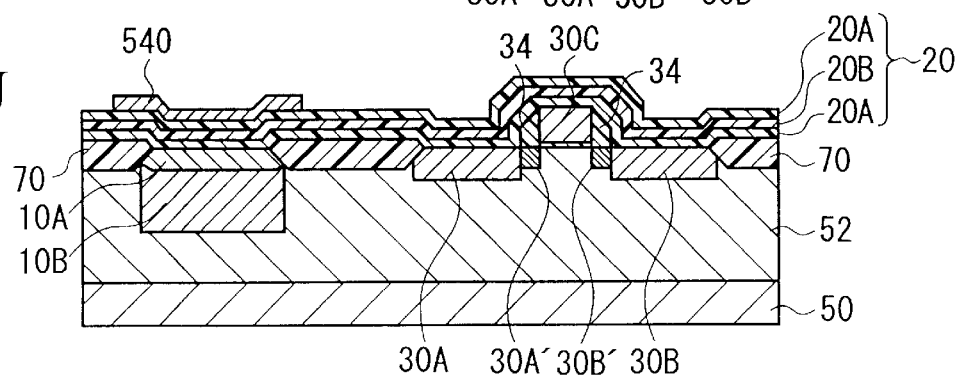

In addition, a mask pattern 530 for covering the photodiode 10 and the silicon oxide film 70 is formed by photolithography, and n-type impurities having a high concentration (such as phosphorus) are injected into portions which will function as source and drain areas, so that a source area 30A and a drain area 30B are formed, in which n-type impurities are diffused with a high concentration (see FIG. 2I). In this process, the side walls 34, 34 function as a mask, so that low-concentration diffusion areas 30A' and 30B' remain under these side walls.

In the next process, a multi-layered antireflection film 20 is formed in an area including the surface of the photodiode 10 (i.e., the surface of the p-type diffusion layer 10A) and the surface of the MOSFET 30 (i.e., the surfaces of the source and drain areas 30A and 30B and the gate electrode 30C). This multi-layered antireflection film 20 is formed by alternately depositing an insulating film 20A which is an oxide film and an insulating film 20B which is a nitride film. A mask pattern 540 is formed on the multi-layered antireflection film 20 by photolithography (see FIG. 2J).

Figure 2K:
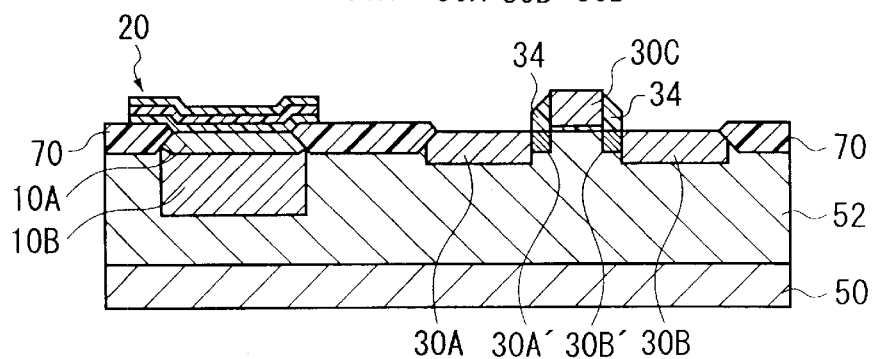

In the next process, the multi-layered antireflection film 20 is made so that it remains on only the surface of the p-type diffusion layer 10A (which will function as the light reception surface of the photodiode 10) and of the vicinity area of the p-type diffusion layer 10A, so that the other portion of the multi-layered antireflection film 20 is removed by etching. (see FIG. 2K).

Figure 2L:
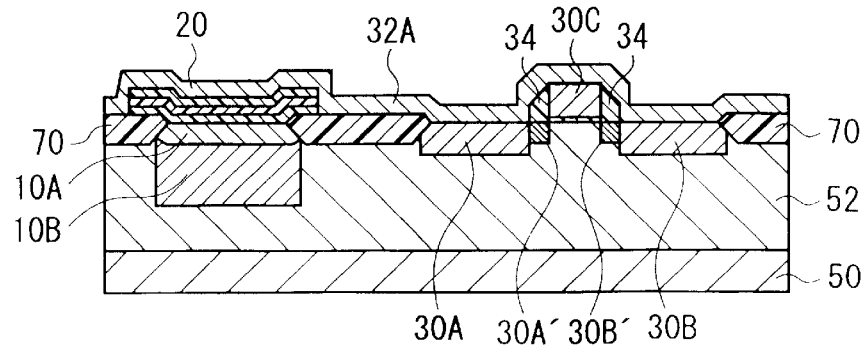
Figure 2M:
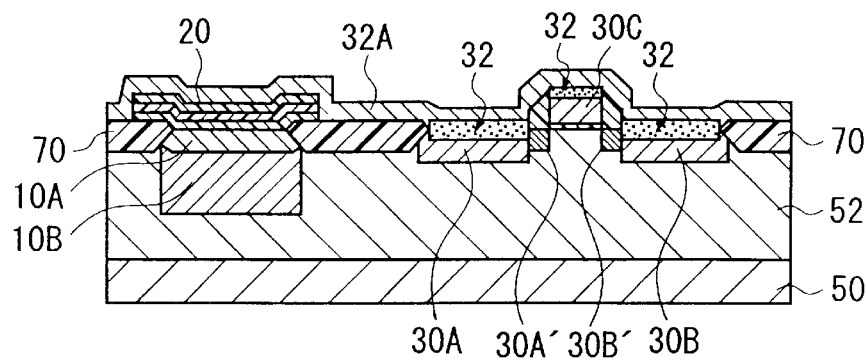
Figure 2N:
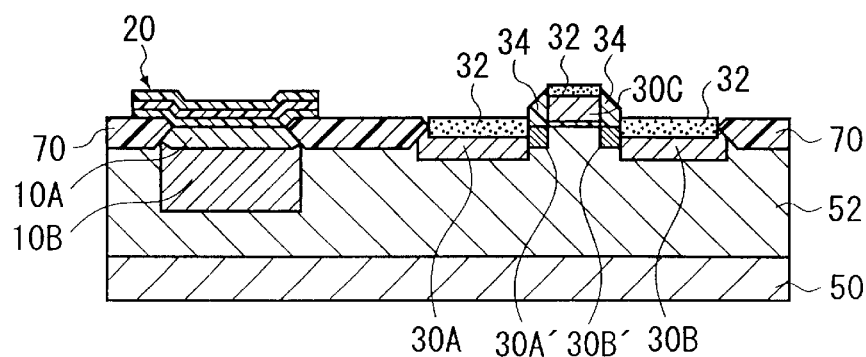

In the next process, a refractory metal layer 32A is formed in an area which includes the surfaces of the source and drain areas 30A and 30B and the surface of the gate electrode 30C (see FIG. 2L). The refractory metal layer 32A is made of Ti, Co, or the like and is provided for forming a silicide layer. The entire portion (i.e., the common substrate including each layer) is then subjected to specific thermal processing, so as to make the refractory metal layer 32A and the silicon component in the surface of the area including the source and drain areas 30A and 30B and the gate electrode 30C react with each other. Accordingly, a silicide layer 32 is formed (see FIG. 2M). Then, the portion of the refractory metal layer 32A, which did not react with silicon, is removed (see FIG. 2N).

Figure 2O:
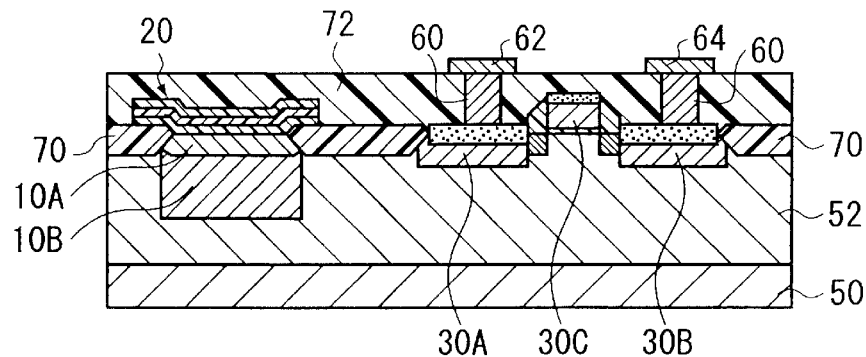
Figure 2P:
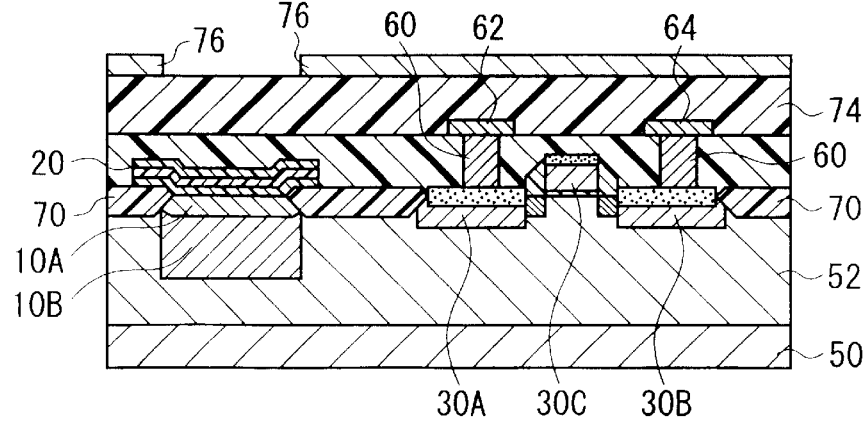

In the next process, a first interlayer insulating film 72 is formed on an area which includes the surfaces of the multi-layered antireflection film 20, diffusion layers 30A and 30B, and gate electrode 30C, and columnar holes for electrically connecting the diffusion layers 30A and 30B with Al wiring lines 62 and 64 (explained below) are formed. After that, conductive contact plugs 60, 60 are formed in the holes. The Al wiring lines 62 and 64 which will respectively function as the source and drain electrodes are then formed on the first interlayer insulating film 72 by using sputtering or the like, in a manner such that these Al wiring lines 62 and 64 are connected to the contact plugs 60, 60 (see FIG. 2O).

In the next process, a second interlayer insulating film 74 is formed on the first interlayer insulating film 72, and an Al shading film 76 is formed by using sputtering or the like on the surface of the second interlayer insulating film 74, except for the portion (of the film 74) which will function as the light reception surface of the photodiode 10. Accordingly, the manufacturing of a CMOS image sensor is completed (see FIG. 2P).

In the above-explained processes, an n-type MOSFET 30 is manufactured. However, a p-type MOSFET or another kind of CMOS transistor can be manufactured via processes similar to those processes; thus, explanations of such similar processes and relevant drawings are omitted here.

Figure 3A:
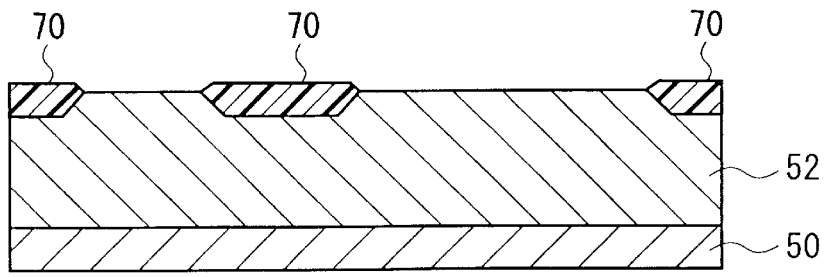
FIGS. 3A to 3P are cross-sectional views for explaining the processes of the second method of manufacturing the CMOS image sensor shown in FIG. 1
Figure 3B:
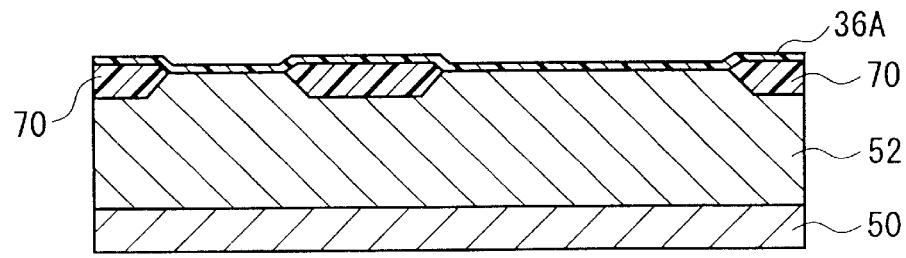
Figure 3C:
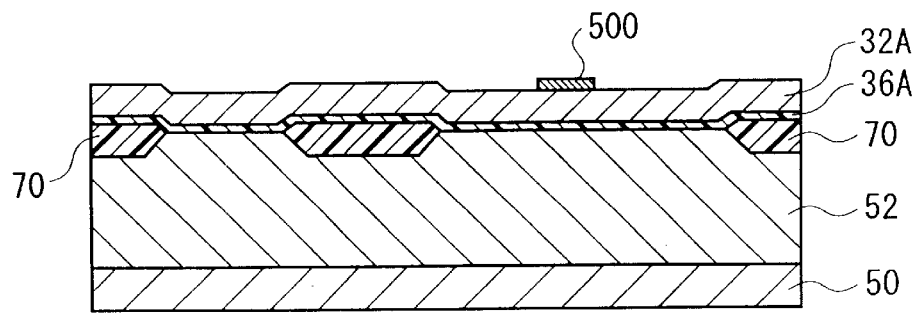
Figure 3D:
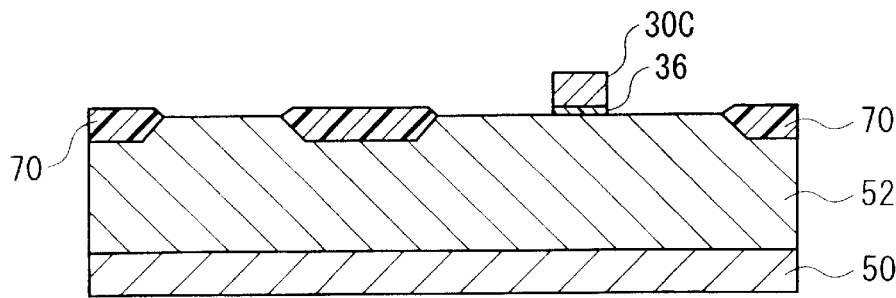
Figure 3E:
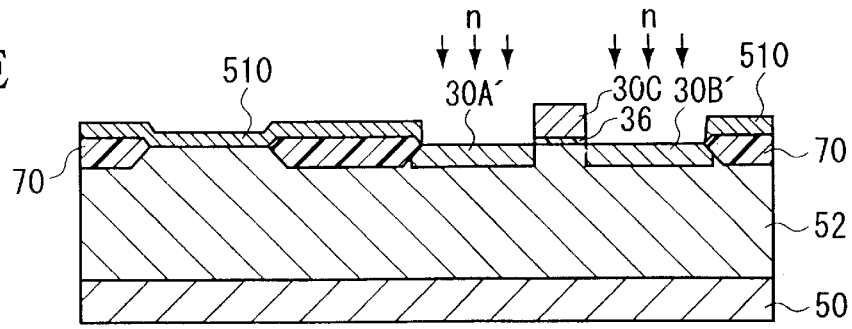

The CMOS image sensor in the present embodiment can also be manufactured by the following method (i.e., the second manufacturing method). This method will be explained below with reference to FIGS. 3A to 3P.

Similar to the previous method, a gate electrode 30C and a gate oxide layer 36 under the gate electrode 30C are formed on a common substrate 50 (see FIGS. 3A to 3D). Low-concentration diffusion areas 30A' and 30B' are then formed (see FIG. 3E).

Figure 3F:
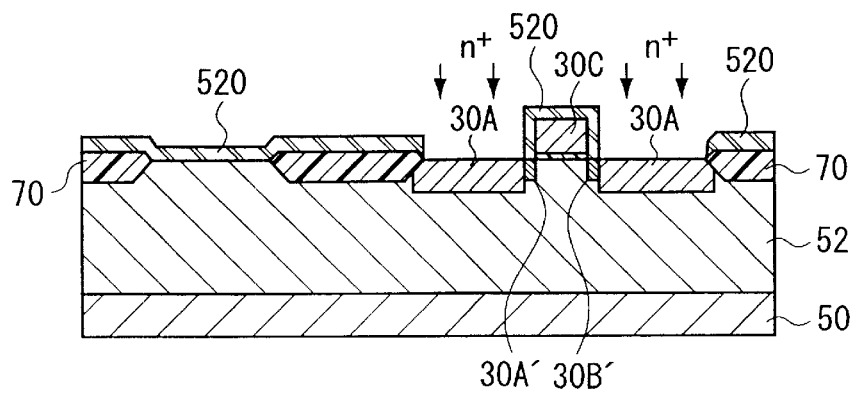

After the mask pattern 510 is removed, another mask pattern 520 as shown in FIG. 3F is formed by photolithography, in a manner such that the gate electrode 30C and its peripheral area are covered and only areas which will function as source and drain areas are exposed. High-concentration n-type impurities (phosphorus or the like) are then injected by ion implantation or the like, so that a source area 30A and a drain area 30B are formed, in which n-type impurities are diffused with a high concentration (see FIG. 3F).

Figure 3G:
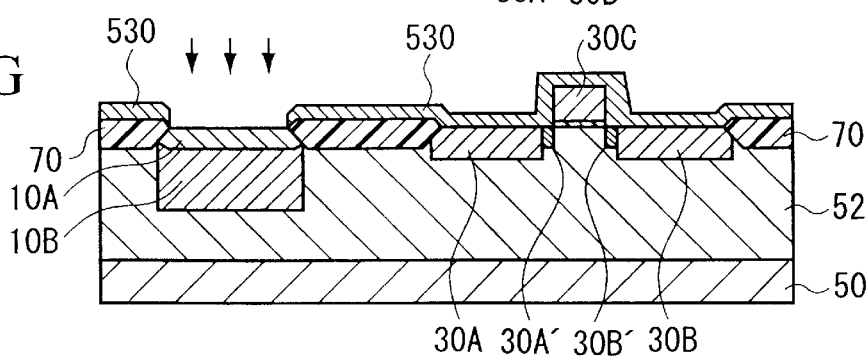

The mask pattern 520 is then removed, and another mask pattern 530 is formed by using photolithography in a manner such that only the portion which will function as a photodiode in a p-type well 52 is exposed. N-type impurities (such as boron) are then injected by ion implantation or the like, so as to form an n-type diffusion layer 10B, and then p-type impurities (such as phosphorus) are injected so as to form a p-type diffusion layer 10A on the n-type diffusion layer 10B (see FIG. 3G).

Figure 3H:
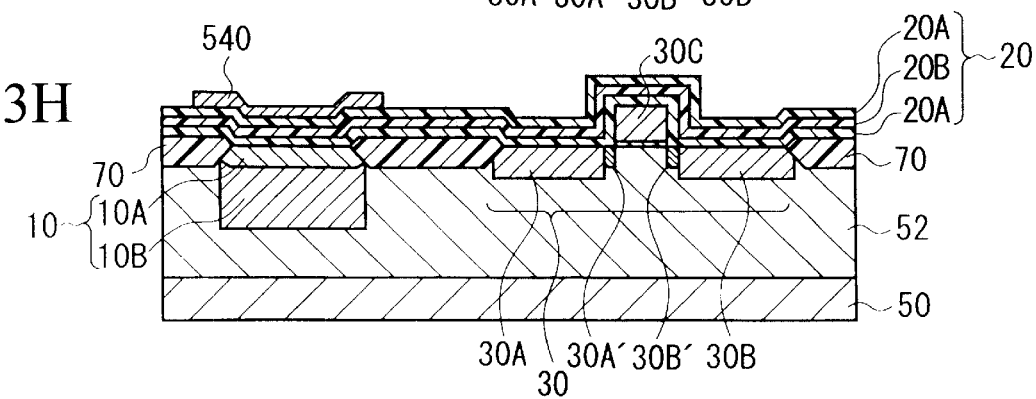

A multi-layered antireflection film 20 is formed on an area including the surfaces of the photodiode 10 (i.e., p-type diffusion layer 10A) and MOSFET 30 (i.e., source and drain areas 30A and 30B and gate electrode 30C). This multi-layered antireflection film 20 is obtained by alternately depositing insulating layers 20A and 20B which are respectively oxide and nitride layers. A mask pattern 540 is then formed on the multi-layered antireflection film 20 by photolithography (see FIG. 3H).

Figure 3I:
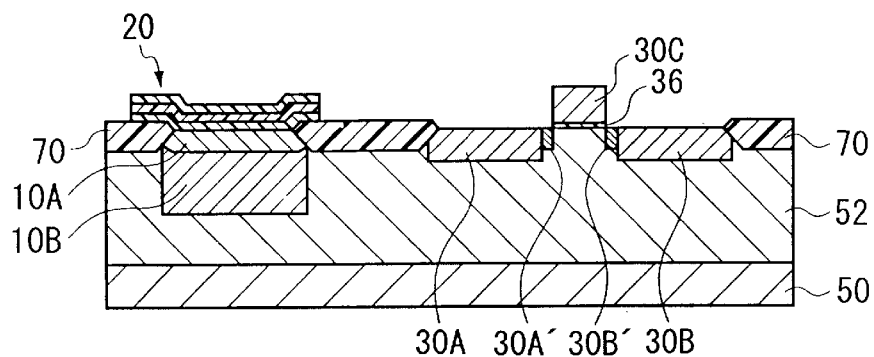
Figure 3J:
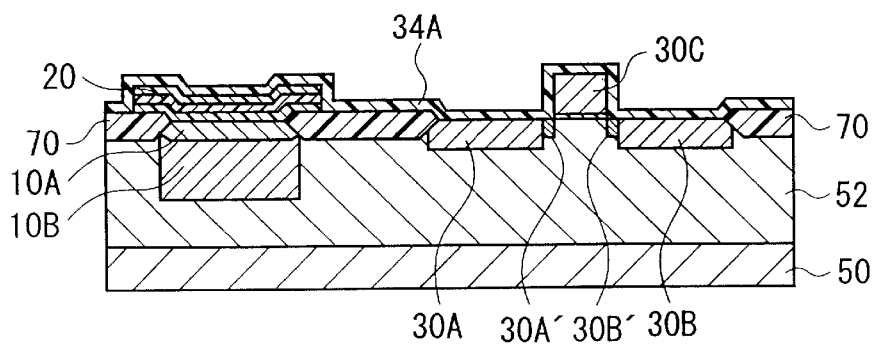
Figure 3K:
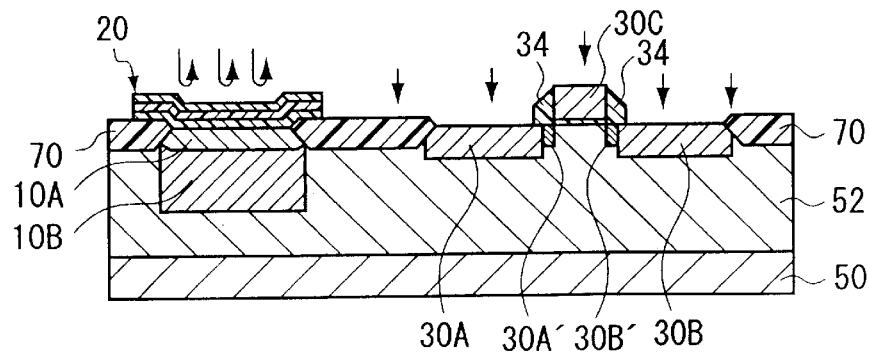

The multi-layered antireflection film 20 is then removed by the etching, except for the surface of the p-type diffusion layer 10A and its vicinity area, where the surface of the p-type diffusion layer 10A will function as the light reception surface of the photodiode 10 (see FIG. 3I). Next, a silicon oxide film layer 34A, which is made of $SiO_2$ or the like and will be used for forming side walls, is formed in an area including the surfaces of the multi-layered antireflection film 20 and the gate electrode 30C (see FIG. 3J). The surface of the silicon oxide film layer 34A is then removed by dry etching employing ions or the like, so that owing to the etch back, side walls 34, 34 are formed at either side of the gate electrode 30C (see FIG. 3K).

Figure 3L:
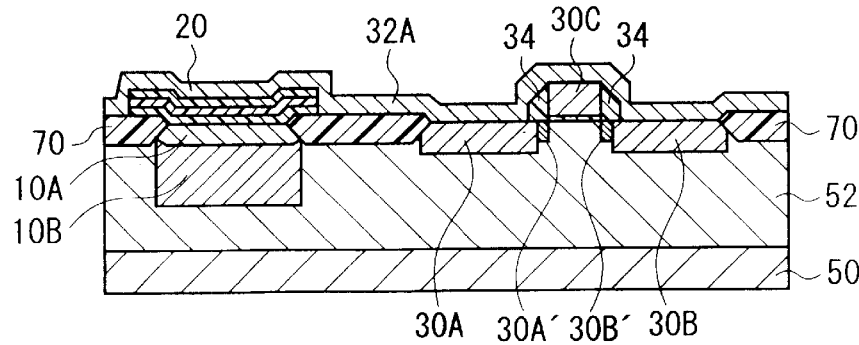
Figure 3M:
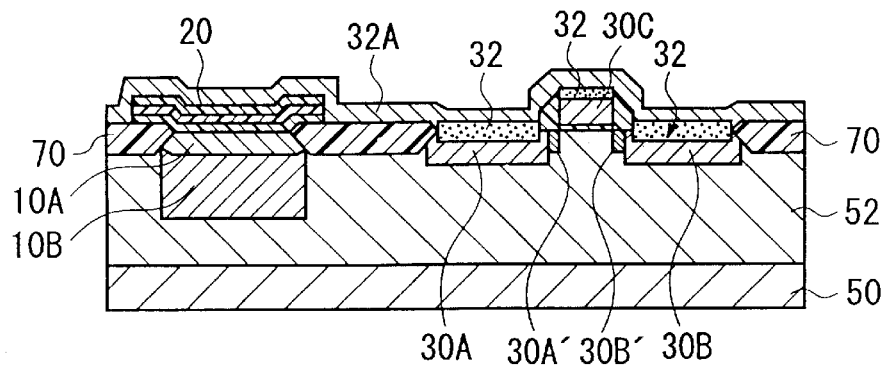
Figure 3N:
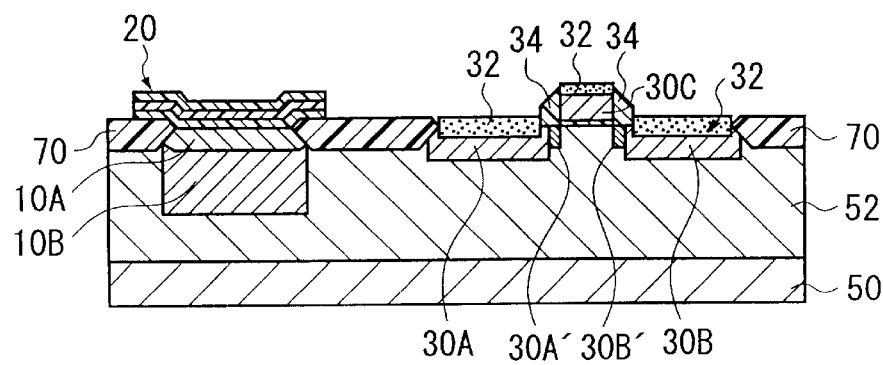
Figure 3O:
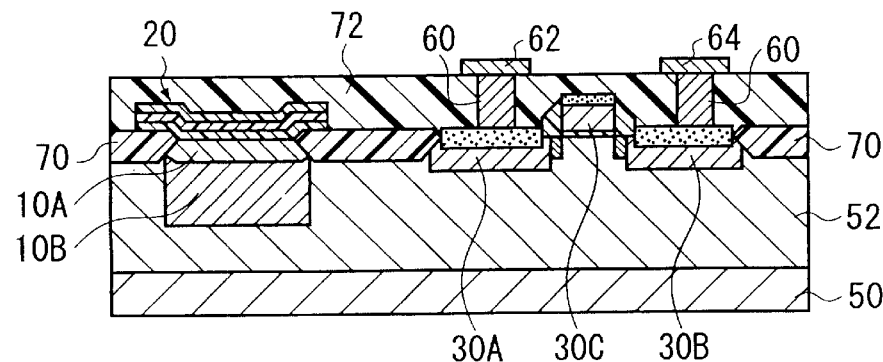
Figure 3P:
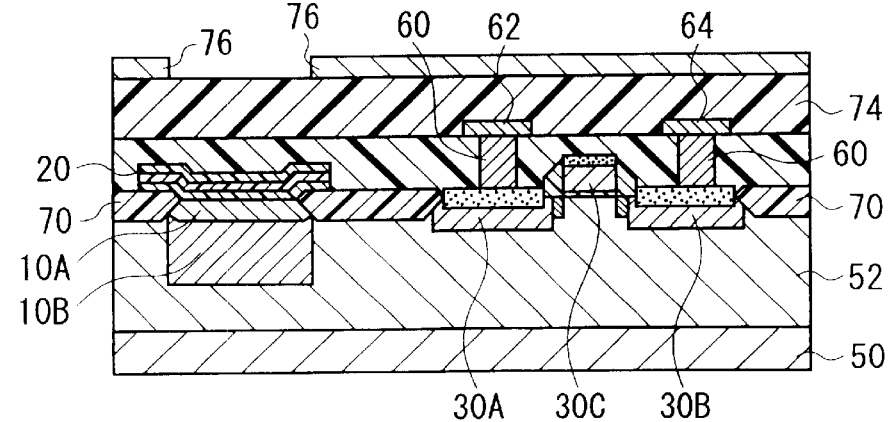

A refractory metal layer 32A made of Ti, Co, or the like, for providing a silicide layer is then formed in an area including the surfaces of the multi-layered antireflection film 20, source and drain areas 30A and 30B, and gate electrode 30C (see FIG. 3L). Then, according to processes similar to those in the previous method, a CMOS image sensor is completed (see FIGS. 3M to 3P).

As explained above, in the method of manufacturing a CMOS image sensor of the present invention, in the process of making the silicide reaction occur in the surface of a diffusion layer of an MOS transistor such as MOSFET 30 (refer to the processes shown in FIGS. 2M and 3M), the insulating multi-layered antireflection film 20 also functions as a mask for preventing a silicide layer from being generated on the light reception surface of the photodiode 10. Therefore, no extra mask-forming process is necessary and a silicide layer can be easily formed, thereby reducing the manufacturing cost.

In the second manufacturing method, in the process of forming the side walls at either side of the gate electrode of the MOS transistor (refer to the process shown in FIG. 3K), the insulating multi-layered antireflection film 20 also functions as a mask for preventing an etch-back effect (occurring when the side walls are formed) from affecting the light reception surface of the photodiode 10. Therefore, no extra mask-forming process is necessary, and side walls can be easily formed, thereby reducing the manufacturing cost. Here, an undesirable example of the etch-back effect is that due to dry etching which employs ions, impurity ions are introduced into a diffusion layer of the photodiode, and a leak of the pn junction in the diode occurs, thereby generating noise in the relevant image.

The present invention is not limited to the embodiments explained above. For example, an n-type well may be formed on a common substrate 50 and a photodiode or a CMOS transistor including a specific n-type or p-type diffusion layer may be formed on the surface of the n-type well. The conditions of depositing an n-type or p-type diffusion layer are also not limited. For example, the photodiode may be a PIN type.

What is claimed is:

1. A CMOS image sensor comprising:
   a photodiode having a light reception surface covered by a multi-layered antireflection film that includes an insulating nitride film sandwiched between and directly contacting two insulating oxide films, the two insulating oxide films having a same first index of refraction different from the first index of refraction; and
   at least one MOS transistor having diffusion layers which respectively function as source and drain areas, wherein a silicide layer is formed on each diffusion layer,
   wherein the photodiode and said at least one MOS transistor are provided on a common substrate and are electrically connected with each other, and
   wherein said multi-layered antireflection film covers only the light reception surface and a peripheral area of said photodiode and does not cover said at least one MOS transistor.

2. A CMOS image sensor as claimed in claim 1, wherein said at least one MOS transistor has a gate electrode which has side walls.

3. The sensor of claim 1, wherein the insulation nitride film is silicon nitride and the two insulating oxide films are silicon oxide.

* * * * *